United States Patent [19]
Shimizu et al.

[11] Patent Number: 5,268,530
[45] Date of Patent: Dec. 7, 1993

[54] SUPERCONDUCTIVE TUBE FOR MAGNETIC SHIELDING AND MANUFACTURING METHOD THEREFOR

[75] Inventors: Hideki Shimizu, Nagoya; Takeyoshi Togashi, Okazaki, both of Japan

[73] Assignee: NGK Insulators, Ltd., Nagoya, Japan

[21] Appl. No.: 799,230

[22] Filed: Nov. 27, 1991

[30] Foreign Application Priority Data

Nov. 30, 1990 [JP] Japan .................... 2-334442
Nov. 30, 1990 [JP] Japan .................... 2-334443

[51] Int. Cl.⁵ .............. H05K 9/00; H01B 12/00; H01L 39/24; H04B 3/28
[52] U.S. Cl. .................... 174/35 R; 505/1; 505/872; 29/599; 174/125.1
[58] Field of Search ........... 174/35 R, 35 MS, 35 L, 174/35 TS, 125.1, 15.4, 15.5; 307/91; 505/1, 843, 844, 845, 846, 872; 29/599

[56] References Cited

U.S. PATENT DOCUMENTS

| | | | |
|---|---|---|---|
| 4,467,303 | 8/1984 | Laskaris | 335/216 |
| 4,585,696 | 4/1986 | Dustmann et al. | 428/375 |
| 4,916,114 | 4/1990 | Hoenig | 505/1 |
| 5,061,685 | 10/1991 | Kosuge et al. | 505/1 |
| 5,068,219 | 11/1991 | Hagino et al. | 505/1 |
| 5,114,908 | 5/1992 | Sato et al. | 505/1 |

FOREIGN PATENT DOCUMENTS

| | | |
|---|---|---|
| 0302354A2 | 2/1989 | European Pat. Off. |
| 0306034A2 | 3/1989 | European Pat. Off. |
| 0393932A1 | 10/1990 | European Pat. Off. |
| 63-280469 | 11/1988 | Japan. |
| 1-134998 | 5/1989 | Japan. |
| 2-71597 | 3/1990 | Japan. |
| 3-131096 | 6/1991 | Japan. |

OTHER PUBLICATIONS

JP1134998, Patent Abstracts of Japan, vol. 013, No. 386, Aug. 25, 1989.
Field Distributions in the Vicinity of a Superconducting Flux Exclusion Tube, Martin et al. Journal of Applied Physics, 460-464, vol. 44, No. 1 (1973).

Primary Examiner—Leo P. Picard
Assistant Examiner—Bot L. Ledynh
Attorney, Agent, or Firm—Shea & Gould

[57] ABSTRACT

A superconductive tube for magnetic shielding has a cylindrical substrate composed of at least two members, an intermediate medium placed upon a surface of the inner and/or the outer wall of the substrate, and a layer containing a superconductive oxide, placed upon the intermediate medium, which are integrally formed in a cylindrical shape.

18 Claims, 6 Drawing Sheets

FIG.3
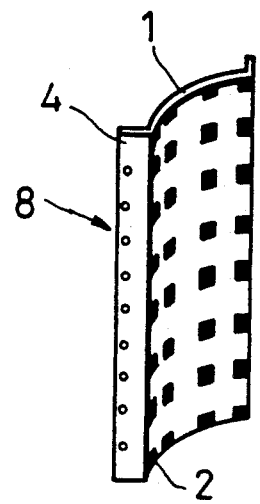
FIG.4(a) FIG.4(b)
FIG.4(c)
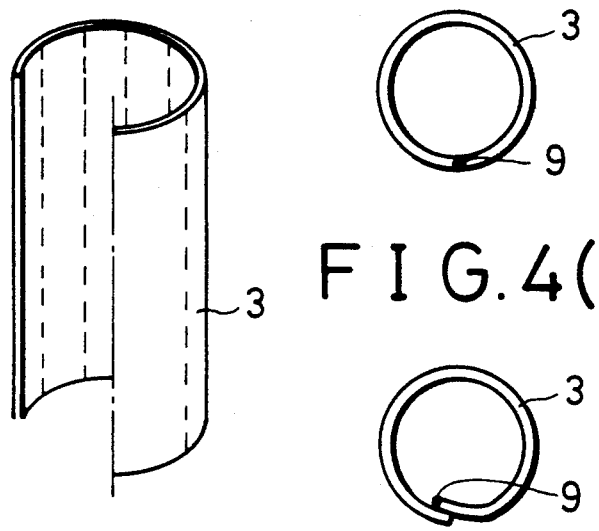

SUPERCONDUCTIVE TUBE FOR MAGNETIC SHIELDING AND MANUFACTURING METHOD THEREFOR

BACKGROUND OF THE INVENTION AND DESCRIPTION OF THE RELATED ART

The present invention relates to a superconductive tube for magnetic shielding as well as to a method for manufacturing such a superconductive tube.

Ferromagnetic materials such as permalloy or ferrite have been utilized to shield the space surrounded by them. Recently, many devices have been introduced to shield the magnetic field by the Meissner effect exerted by superconductors. For example, in Japanese Patent Laid Open No. 1-134998 (1989) superconductive materials were arranged to the innermost side of the space in which the magnetic field is shielded. In U.S. patent application Ser. No. 509,438 a tube for magnetic shielding, i.e., shielding a magnetic field, has been proposed by the present applicants that comprises at least two layers which include a layer of a substrate and a layer of superconductor arranged in this order from the magnetic source to be shielded.

However, a tube for magnetic shielding using an oxide superconductor that can be used in actual practice has remained in a developing stage at present. When superconductive materials are merely combined, a magnetic field is known to leak through the joints, and high performance in shielding a magnetic field cannot be achieved. This makes it necessary to form a structure of superconductive materials in an integral form. However, as the structure of superconductive materials become larger, it becomes more difficult to integrally form a structure of superconductive materials; it is not industrially preferable that the apparatus for manufacturing them becomes larger.

On the other hand, for a large-size tube for magnetic shielding it is required to use a metal or other robust material as a substrate to keep the mechanical strength of the tube. When a layer of oxide superconductor forms on a metal substrate, there remains a problem that the metal in the substrate reacts with the oxide superconductor; this problem is especially aggravated with compounds belonging to a Bi-Sr-Ca-Cu-O system. To solve this problem it is customary to include an intermediate medium with a noble metal between the substrate and layer of oxide superconductor to prevent the reaction.

However, this solution poses another problem. It is difficult to form the intermediate medium uniformly over a large-size metal substrate, and more difficult to form a layer of oxide superconductor uniformly on the intermediate medium. As a result satisfactory superconductive properties cannot be obtained.

SUMMARY OF THE INVENTION

An object of the present invention is to provide a superconductive tube for magnetic shielding with excellent superconductive properties in shielding the magnetic field inside the tube from disturbances or vice versa by using an oxide superconductor, as well as to a method of manufacturing such a superconductive tube.

Another object of the present invention is to provide a large-size superconductive tube with excellent superconductive properties having high critical current density.

According to the present invention, there is provided a superconductive tube for magnetic shielding, comprising: a cylindrical substrate composed of at least two members; an intermediate medium placed upon the surface of the inner and/or the outer wall of the substrate; and a layer containing a superconductive oxide upon the intermediate medium.

According to another aspect of the present invention, there is provided a tube for shielding a magnetic field, wherein the intermediate medium comprises a layer containing ceramics placed on the surface of the inner and/or the outer wall of the substrate and another layer placed on the layer containing ceramics and also contacting the layer of oxide superconductor.

According to another aspect of the present invention, there is provided a method for manufacturing a superconductive tube for magnetic shielding which comprises forming an intermediate medium upon the surface of the inner and/or the outer wall of certain members, making a cylindrical substrate by connecting the members, and forming a layer containing a superconductive oxide on the intermediate medium on the cylindrical substrate.

According to another aspect of the present invention, a method for manufacturing a superconductive tube for magnetic shielding comprises forming an intermediate medium upon the surface of the inner and/or the outer wall of certain members, making a cylindrical substrate by connecting the members, preparing a cylindrical shell of a noble metal, placing the cylindrical shell upon the cylindrical substrate to make a cylindrical green tube, and forming a layer containing a superconductive oxide upon the surface of the cylindrical shell of the cylindrical green tube.

BRIEF DESCRIPTION OF THE DRAWINGS

Both

FIG. 3 shows, as an example, a member with an intermediate medium comprising a glass or ceramic layer partially placed on itself.

FIGS. 4(a)-4(c) shows a cylindrical shell of a noble metal that will become a layer of a noble metal on the intermediate medium in the tube.

DETAILED DESCRIPTION OF THE INVENTION

The present invention is hereinafter described in detail.

The present invention resides in a tube or tubes shielding the magnetic field inside the tube or tubes from disturbances outside or vice versa, having a cylindrical substrate, an intermediate medium placed upon the inner and/or the outer wall of the substrate, and a layer containing a superconductive oxide placed upon the intermediate medium, as well as in a method for manufacturing such a tube.

The tube of the present invention may shield a magnetic field inside from a perturbation outside; thus the magnetic field inside the tube has a low magnetic field with high homogeneity. Moreover, the tube of the present invention prevents the adverse effects on the magnetic field inside caused by the perturbation of the magnetic field generated by the vibration of the substrate and/or the intermediate medium.

The tube of the present invention may shield the magnetic field inside from affecting the field outside when the source of a strong magnetic field is kept inside the tube. In this specification the phrase 'a tube shielding the magnetic field itself' refers to this case also.

The basic structure of a superconductive tube for magnetic shielding according to the present invention is composed of a cylindrical substrate, an intermediate medium placed upon the surface of the inner and/or the outer wall of said substrate, and a layer containing a superconductive oxide placed upon the intermediate medium.

Figure 7A:
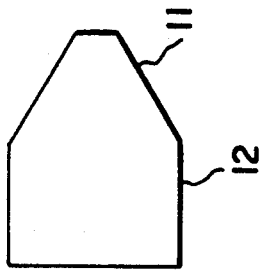
FIGS. 7(a)-7(c) show cross-sectional views of the tube of the present invention.
Figure 7B:
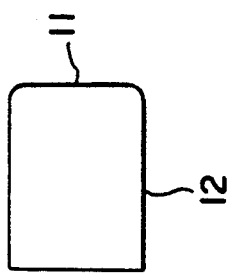
Figure 7C:
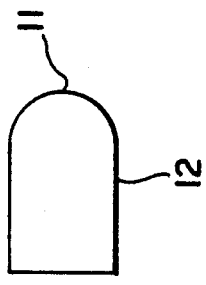

The tube can have essentially any shape and size depending on its application. A cylindrical shape is preferred, though a cross section of a cylindrical shape in this specification is not limited to a circle; an eclipse, truncated circle, triangle, rectangle, polygon, etc. are included. Examples of different cross-sectional areas taken along the longitudinal axis of the tube are shown in FIGS. 7(a)-7(c). A circle is preferred as a shape of the cross section for the tube in the present invention.

Likewise, the axis of the cylindrical shape according to the present invention is not restricted to one that is perpendicular to the top or the bottom plane of the cylindrical tube to be formed. However, the axis of the cylindrical shape is preferred to be perpendicular to the bottom plane of the shape. The word 'cylindrical' is used in this broadened meaning in this specification.

The tube of the present invention may have the bottom of the cylindrical tube open in some applications and may have it closed with a member or members protruding outside the tube in other applications.

As the material for the substrate, any material can be used that has enough mechanical strength to support itself and numerous layers placed on it. For example, such ceramic materials as zirconia and titania as well as noble metals, alloys and such metals as stainless steel (SUS 430, SUS 310, and SUS 320, specified in JIS), Inconel, Incolloy, and hasteloy can be used. There is no restriction on the thickness of the substrate.

The intermediate medium plays very important roles. First, it prevents the oxide superconductor from reacting with a metal used as a substrate. Without the medium, when a common metal or an alloy other than noble metals and an oxide superconductor are used as materials for a substrate and an oxide superconductor layer, respectively, the metal and the oxide superconductor react significantly during firing, resulting in poor performance in superconductivity in the final product. In this particular case, the use of a noble metal as a substrate seems to allow the oxide superconductor not to react with the substrate and solves this problem. However, this solution is not realistic due to the inevitable expensive cost incurred by the use of a noble metal. Instead of a metal or an alloy, when a ceramic is used as a substrate, it is not easy to obtain a substrate in a large size, though mechanical strength and resistance against chemical reactions are satisfied. Therefore, the use of a common metal as a substrate and the presence of the intermediate medium are preferred.

Therefore, for the tube according to the present invention it is preferred to use a material as a substrate that maintains the mechanical strength up to the sintering temperature of the oxide superconductor. Moreover, it is preferable that the material is easily obtained in a desired size and the shape.

It is preferred to include at least one layer in the intermediate medium, for instance a noble metal layer, to prevent the reaction between the substrate and a layer containing the superconductive oxide.

Moreover, it is also preferred that the intermediate medium has excellent adhesion onto the substrate over a wide range of temperatures from the sintering temperature of the oxide superconductor to a cryogenic temperature, like that of liquid nitrogen. This function of adhesion can be attained by placing another layer for adhesion in the intermediate medium between the layer to prevent the reaction and the substrate; this adhesive layer is made from such binding materials as glass, various kinds of ceramics, metal pastes and noble metal pastes.

Furthermore, it is preferred that the intermediate medium can attain the foregoing functions and also acts as a moderator to moderate thermal impact shocks exerted in cold/heat cycles when the tube is applied to repeated cycles between two drastically different temperatures such as cryogenic temperature and room temperature. In other words, in applications it is quite expected that the tube in the present invention undergoes drastic temperature changes in a short period of time; for example, a tube in the present invention is cooled down by liquid nitrogen to exert superconductive properties, and then the tube is left at room temperature.

When the intermediate medium is composed of two layers in which glass or ceramics and a noble metal are used as materials for the adhesive layer placed on the substrate and for a layer placed on the adhesive layer to prevent reaction with the oxide superconductor respectively, it is preferred to dispose the glass or ceramic layer partially, not entirely, over the surface of the substrate, in a preferable manner, for example, in stripes, dots, a lattice pattern, random pattern, and any combinations of these (FIG. 3). The partial coverage of the glass or ceramic layer over the surface of the substrate is suitable. This local structure can moderate shocks due to thermal impact during cold/heat cycles so that the tube maintains stable performance to shield the magnetic field inside the tube.

The intermediate medium is thick enough to prevent the reaction between the substrate and the layer containing the superconductive oxide, and the thickness may be selected appropriately so as to minimize the overall thermal stresses affected by various physical properties such as the thermal expansion coefficient, modulus of elasticity and mechanical strength, as well as the thickness of the layer containing the superconductive oxide and the metal substrate. For instance, when a noble metal such as gold or silver is used as the material for a layer to prevent the reaction, the thickness of the layer should be greater than 30 $\mu$m to achieve the purpose.

When a heat resistant metal such as stainless steel and inconel is used as a metal substrate, and when the intermediate medium is composed of a glass or ceramic layer on substrate and a layer of noble metal on the glass or ceramic layer, preferably the thickness of the layer of the noble metal is greater than 50 $\mu$m in view of the thermal expansion coefficient, the modulus of elasticity and the mechanical strength of the layer containing superconductive oxide, the metal substrate, the glass or ceramic layer and the noble metal layer, since the effect as the moderating material described above can be fully attained.

Furthermore, when a noble metal is used in the layer to prevent the reaction, the thickness of the layer is preferably between 50 and 700 μm and, more preferably, between 100 and 600 μm. When the thickness of the noble metal layer is less than 50 μm, the expected performance as the moderating material described above cannot be obtained. On the other hand, when thickness of the noble metal layer is greater than 700 μm, the thermal stress due to the difference of thermal expansion between the oxide superconductor and the noble metal layer may become predominant rather than the performance as a moderating material. Moreover, the cost increases with thickness without any improvement in performance as a moderating material.

When the intermediate medium is composed of only one layer of glass or ceramics and another of a noble metal, the thickness of the glass or ceramic layer is preferably within a range from 50 to 250 μm. Preferably the thickness of the glass or ceramic layer is not beyond the above-mentioned range, since thermal stress remains in the layer generated during firing to form the layer containing the superconductive oxide. Upon cooling to cryogenic temperatures such as that of liquid nitrogen such stress remaining in the layer exceeds the mechanical strength of the tube, causing cracks.

The oxide superconductor useful in the present invention has no particular restriction on materials and can be any oxide superconductor or a combination such as rare earth oxide superconductors having a multi-layered perovskite structure with a M-Ba-Cu-O system in which M is one or more rare earth elements selected from Sc, Y and lanthanides such as La, Eu, Gd, Er, Yb and Lu. Another example is an oxide superconductor in a Bi series having such compositions as $Bi_2Sr_2Ca_1Cu_2O_x$ and $Bi_2Sr_2Ca_2Cu_3O_x$.

The tube according to the present invention has a structure such that a layer containing a superconductive oxide is placed upon the intermediate medium that is further placed upon surface of the inner and/or the outer wall of a cylindrical substrate, and the cylindrical substrate is not integrally formed initially but is made of at least two members joined together. A member can take any shape and size, and any mode in which the members are combined.

Figure 1:
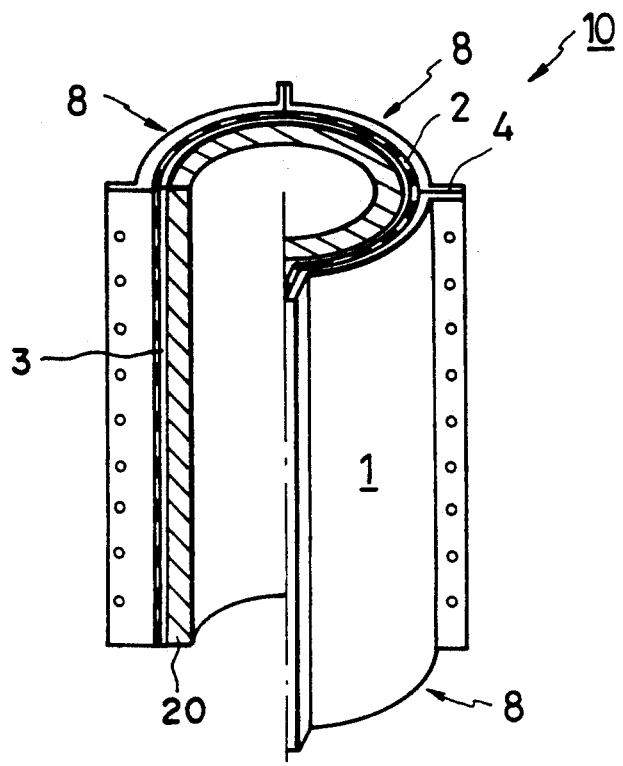
FIG. 1 and FIG. 2 show modes of joining members in the present invention.
Figure 2:
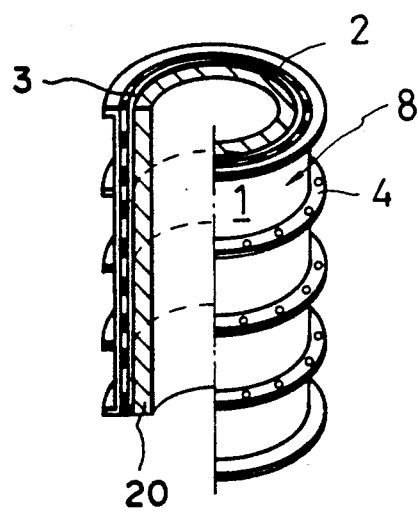

For instance, FIGS. 1 and 2 illustrate typical examples of modes of composing a cylindrical substrate out of members that do not include a member in the bottom portion. Some laminated members 8 each of which has at least one layer on it as shown in FIG. 3 are combined and joined as shown in FIG. 1. In this case the substrate is made of four identical members whose joints are parallel with the axial direction of the cylindrical substrate to be formed. Though this particular example illustrates a case in which members to form a substrate have a layer on them, it should be noted that in general a layer on a member is not required.

FIG. 2 shows another mode of combining members into a substrate; the joints of the four members are perpendicular to the axial direction of the cylindrical substrate to be formed.

Figure 5A:
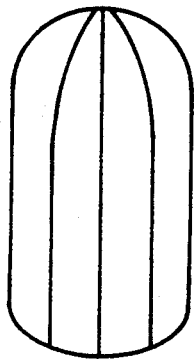
FIGS. 5(a)-5(i) shows modes of joining members to compose the tube of the present invention.
Figure 5B:
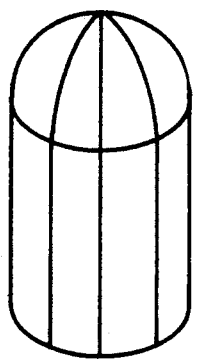
Figure 5C:
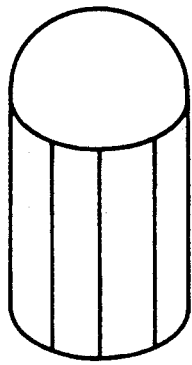
Figure 5D:
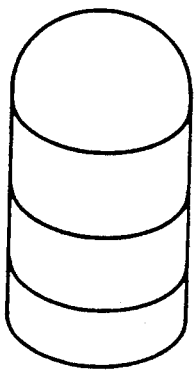
Figure 5E:
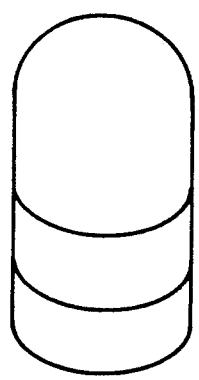
Figure 5F:
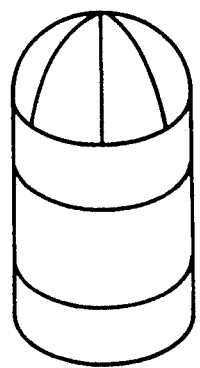
Figure 5G:
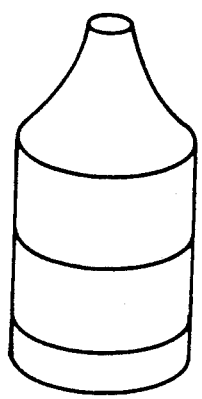

FIGS. 5(a)–(i) illustrate further modes of combining members into a substrate. In FIGS. 5(a), (b), (c), and (h) the joints of the members are parallel to the axial direction of the cylindrical substrate to be formed, while in FIGS. 5(d) and (e) they are perpendicular to the axial direction of the cylindrical substrate to be formed. FIGS. 5(g), (h), and (i) illustrate a general structure that contains one opening at the bottom plane of the tube and another with a smaller diameter than the other at the top of the structure to introduce wiring for, for example, a sensor. In FIGS. 5(g) and (i) the joints of members are perpendicular to the axial direction of the cylindrical substrate to be formed while in FIG. (h) they are parallel to the axial direction.

As one shape, a member integrally contains both components that become part of the side and part of the top portions in the cylindrical substrate to be formed. As another shape, a member contains only the component that becomes either the side or the top portion of the cylindrical substrate to be formed; in other words, the side and the top part of the cylindrical substrate to be formed are independently made and then combined.

FIGS. 5(a) and (h) show the former case. In contrast FIGS. 5(b), (c), and (h) show the latter case. In FIG. 5(b) the top portion of the cylindrical substrate to be formed is made of more than one member while in FIG. 5(c) it is integrally made out of one member. In FIG. 5(f) the joints in the side and the top portion of the cylindrical substrate to be formed are perpendicular and parallel to the axial direction of the cylindrical substrate to be formed, respectively.

As shown above, various modes of combining members into a cylindrical substrate are available, and a preferable mode can be chosen depending on its application. The factors to consider for the preferable mode include the purpose of the application, actual conditions of the application, the intermediate medium, the oxide superconductor in a layer, methods of binding members, methods of placing the intermediate medium upon the substrate, and the like.

There are numerous variations of the members for shapes, sizes, and surface treatments before joining them.

Figure 6A:
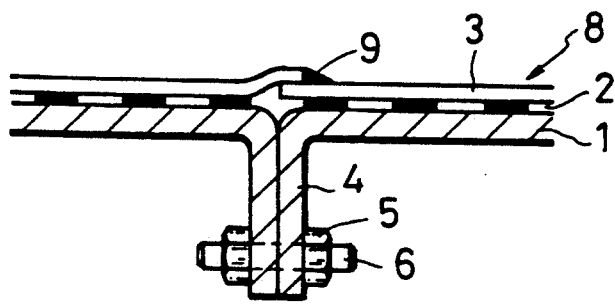
FIGS. 6(a)-6(e) shows how two members and the intermediate members placed on them are joined together.
Figure 6B:
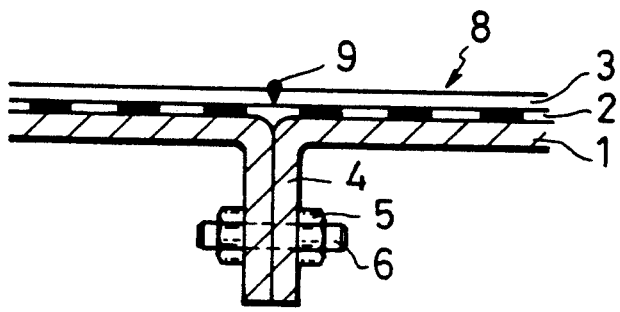
Figure 6C:
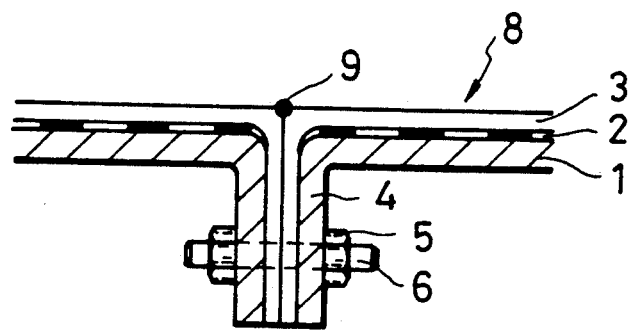
Figure 6D:
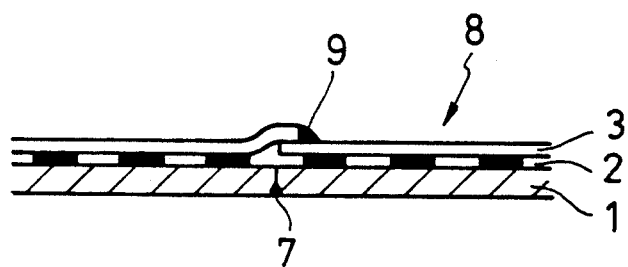

For instance, FIGS. 6(a)–6(e) shows typical modes of joining members. In FIGS. 6(a)–6(c) a member 1 includes flanges, and the flanged portions 4 of two members are joined by nuts 5 and a bolt 6. With a flange as part of a member, it is preferred to cut the corner (i.e., chamfer) between the flat plane of the member and the flanged portion. After joining the Ag layer later, the curved portions around the joint thus formed help to reduce the protrusion of the Ag layer along the joint. In FIGS. 6(d) and (e) members do not contain a flange. The joint 7 between two members is formed by abutting the members against each other and joined by welding or other appropriate methods when the members are made of metal or by glass when the members are made of ceramics.

Figure 6E:
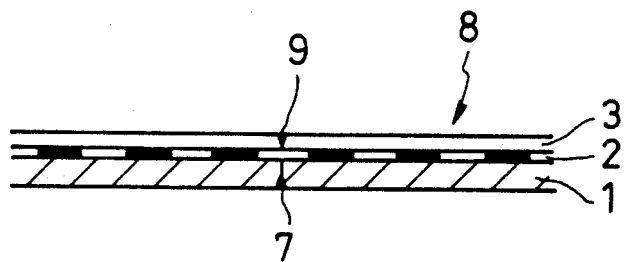

In FIG. 6(e) the joint 7 between two adjacent members needs to be welded along with that between the two corresponding adjacent layers of a noble metal 3 on the two members 1. In such a case the melting point of the noble metal may differ greatly from that of the metal used as the substrate, and the one with the lower melting point may partially melt upon welding of the other. When this incidence happens, it is not necessary to weld the entire cross section of the joint of the metal with the higher melting point; built-up welding or other preferable methods may suffice as long as the practical mechanical strength is satisfied.

In the present invention a layer in the intermediate medium may be deposited on members before they are joined to form a cylindrical substrate. When the height of the cylindrical substrate, being parallel to the direction of the principal axis, is relatively short such as those of less than 500 mm, the members may be joined into a cylindrical substrate and then shaped integrally. Usually, it is preferred to form the medium on the members before joining them.

The intermediate medium can be formed by any known method, which can be selected properly depending on the intermediate medium. The glass layer or the ceramic layer can be formed, usually, by a coating method such as spray coating using a slurry composed of the ingredients for a layer of the intermediate medium or appending thin films formed in accordance with the shape for each of the members.

A layer of noble metal made of, for example, silver and gold is usually formed by connecting foils upon the glass layer on a member or a cylindrical substrate. Alternatively, a shell of noble metal in a cylindrical shape may be independently formed by connecting foils.

One preferred method of manufacturing a tube with the intermediate medium composed of two layers is shown below. A layer made out of glass is formed on members before joining them. Then a cylindrical substrate with the glass layer is formed by joining the members. Independently a shell of a noble metal is prepared such that this shell matches with the surface of the glass layer in the cylindrical substrate. Finally the shell of the noble metal is placed upon or within the cylindrical substrate.

It is especially preferable to place a cylindrical shell of a noble metal independently prepared upon a cylindrical substrate having a partial glass or ceramic layer on its outer and/or inner surface. In this green tube a layer of a noble metal is attached to a substrate only through the partial glass or ceramic layer, which leaves space between the layer of noble metal and the substrate in the area that the glass or ceramic layer is absent. Upon the completion of the tube in this invention this space is considered to play a very important role in absorbing different thermal expansions between the substrate and a layer containing an oxide superconductor.

Various kinds of structures that also relate to manufacturing methods can be adopted for the intermediate medium placed upon members. For instance, in FIG. 6, the intermediate medium is composed of a glass or ceramic layer 2 placed on the member 1 and Ag layer 3 placed on the glass or ceramic layer. In FIGS. 6(d) and (e) members with the intermediate medium 8 that are joined do not contain a flange, and the glass or ceramic layer 2 is formed on the member 1 and the silver layer 3 is on the glass or ceramic layer.

In contrast, the other three figures in FIG. 6 contain flanges. In FIGS. 6(a) and (b) no layer is formed on the portion above the flange 4. In detail, the glass layer 2 of about 100 to 200 μm thickness is formed on the member 1 except for the flanged portion 4. Another silver layer 3 is placed upon this glass layer; as a result this silver layer 3 does not form on the portion above the flange 4, either.

In FIG. 6(c), however, the silver layer 3 is formed directly upon surface of the portion above the flange 4. Like FIGS. 6(a) and (b), the glass layer is formed on the member 1 except for the flanged portion. The Ag layer 3 is formed on the glass layer and also on the portion of the flange 4.

The intermediate medium formed on each of the members as described above is also joined together along with the members. Therefore, both the intermediate medium and the substrate constitute a tube with a cylindrical shape as a whole. In this case, the intermediate medium formed on the members may be joined in accordance with the joining mode of the substrate. For instance, in the mode shown in FIGS. 6(a) and (d), in which the Ag layer 3 is placed on the glass or ceramic layer 2 placed on the member 1, the edge of the Ag layer on one member extends above the edge of the Ag layer on another member to result in stacking of the two Ag layers along the joint. Then the point of contact 9 between the top end of the upper Ag layer and the lower Ag layer are joined by welding or using an Ag paste.

In another mode as shown in FIGS. 6(b), (c) and (e), they are joined at the point of contact 9 in the Ag layer formed on the substrate by welding or using an Ag paste. After the Ag paste is coated two adjacent Ag layers, firing was applied at between about 800° and 900° C. to complete the joining of them. Then it is preferred to polish and smooth the portion welded or coated by the Ag paste by a grinder or other appropriate known methods because a smooth surface on the intermediate medium helps a layer containing superconductive oxide placed upon it to become smoother.

FIG. 4 shows a mode of manufacturing the tube according to the present invention. In this mode the intermediate medium is composed of two layers, and one of them is independently formed in advance into a cylindrical shell out of a noble metal. In FIG. 4(a), for example, silver foils of a thickness ranging from 300 to 500 μm are overlapped to some extent or abutted against each other and then joined to form a silver shell 3 in a cylindrical shape. The method in which the silver foils are joined is basically the same as that used in a silver layer formed on members. In FIG. 4(b), silver foils are joined at the point of contact 9 of the foils by either welding or Ag pastes. In FIG. 4(c) a small portion of one end of a silver foil overlaps that of another and then the point of the contact 9 is joined by either welding or Ag pastes.

Then the silver cylindrical shell 3 thus formed is supported by a core material made of any kind of appropriate material, and the silver cylindrical shell 3 is placed upon a cylindrical substrate having at least a glass layer in the intermediate medium.

FIG. 1 shows an example of placing the silver foil 3 upon a cylindrical shell with members 8 that have a sole layer of glass 2 as part of the eventual intermediate medium. First the four members with a glass layer are placed along the periphery of the silver cylindrical shell 3 in such a way that the four members are arranged to become a cylindrical substrate upon firing. Then this whole structure is fired at a firing temperature to place the silver cylindrical shell 3 upon the glass layer 2 on the members 8. Finally, the flanges 4 on the members 8 are bound by bolts and nuts to form a tube 10 in a cylindrical shape composed of a substrate with the intermediate medium on it. Without flanges, by welding members can be joined together by welding to become an integral tube in a cylindrical shape.

In the tube according to the present invention, the layer containing a superconductive oxide described above is integrally formed on the intermediate medium so that the resultant overall structure comprises a substrate, the intermediate medium, and a layer 20 containing the superconductive oxide. The layer containing the superconductive oxide binds onto the intermediate medium by any of known methods such as coating, spraying, and doctor blading. Usually spray coating is applied to the surface of the intermediate medium, followed by sintering at about 800° to 1150° C. to form a layer containing the superconductive oxide. No particular restriction applies to the thickness of the layer containing the superconductive oxide. Depending on its application, the thickness of the layer can be properly chosen to satisfy required performance to shield the magnetic field inside the tube by considering superconductive properties, materials used as the superconductive oxide, and the like.

Figure 8A:
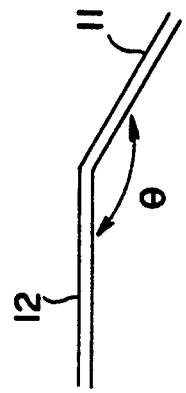
FIGS. 8(a)-8(b) respectively show a radius of curvature and a blunt angle formed between the rim and the bottom member of the tube of the present invention.
Figure 8B:
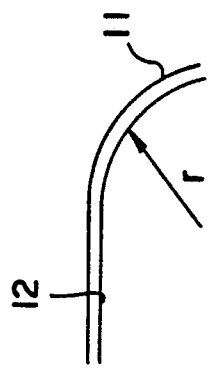

When the tube in the present invention contains bottom members, it is preferable that the bottom members 11 are connected to a rim of the tube 12 with a smooth curvature or blunt angles r and θ, respectively, as shown in FIGS. 8(a) and 8(b). Here a blunt angle and an acute angle are to mean any angle θ ranging from 90 to 180 and 0 to 90 degrees, respectively, and this angle shall be measured from inside of the tube. When a bottom member is connected to a rim of the tube with a right angle or an acute angle, or when the radius of the curvature is less than 5 mm at the connection part of rim, the properties of the tube to shield a magnetic field inside it significantly deteriorate due to cracks around the connected portion caused by mechanical stresses generated by the thermal shock created by the heat/cold thermal cycle mentioned before. Any member that composes the bottom plane of the tube is preferably joined in a blunt angle for the same reason.

Figure 5H:
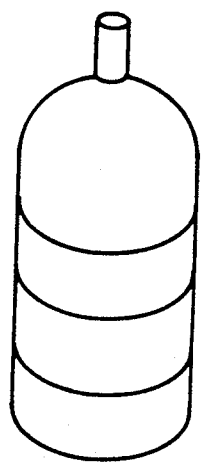
Figure 5I:
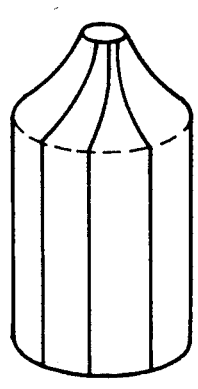

Preferably the tube in the present invention contains two openings with different inner diameters as shown in FIGS. 5(g)–(h), because the opening with the smaller diameter is quite convenient in introducing lines of sensors etc.

EXAMPLES

The present invention will now be described more in detail but it is not intended to be limited to the following examples.

EXAMPLE 1

Four pieces of a member having flanges at two positions were manufactured out of inconel such that a tube of 500 mm in diameter and 1000 mm in height in the direction parallel to the main axis was formed by combining them along the joints in parallel with the axial direction of the tube as shown in FIG. 1. Each of the members was surface treated by sand blasting. Then, except for the flange portion a glass slurry was spray coated onto each of the members under masking of a paper tape in a lattice-like pattern, as shown in FIG. 3. As shown, the masking produces a plurality of square-shaped deposits equally spaced at 30 mm intervals, followed by firing between about 800° and 900° C. for one hour to form a glass layer in a lattice-like pattern with a thickness of 100 μm.

Subsequently, Ag foils with a thickness of 300 μm were placed over the glass layer on the inconel substrate such that the Ag foil extended slightly beyond the side of the flange. Then the glass layer and the Ag foil were bound by heating at 850° to 900° C. for one hour. Subsequently, respective flanges of the four members laminated with the intermediate medium were abutted against each other and fixed by means of bolts and nuts in the mode shown in FIG. 6(a), to form a cylindrical tube. The contact on the overlapped portion of the Ag foils was connected by welding, and then the connected portion was smoothed out by a hand grinder.

On the Ag layer on the cylindrical green tube thus obtained, a slurry containing oxides that give $Bi_2Sr_2Ca_1Cu_2O_x$ upon firing was spray coated, and the resultant tube was heated under an oxygen atmosphere to 885° C. for 30 min to form and partially melt the superconductive oxide. Subsequently, the tube was gradually cooled down, or annealed, to 850° C. at a rate of 1° C./min, and was held at 850° C. for 15 hr to crystallize the superconductive oxide. Then after changing the oxygen atmosphere into that of nitrogen the tube was treated at about 700° C. for 10 hr to produce a tube coated with a Bi(bismuth)-system oxide superconductor having a thickness between about 250 to about 350 μm. The tube obtained had satisfactory appearance by visual observation, and was evaluated for the alternate heating and cooling (heat/cool) cycle. Even after the heat/cool cycle both the appearance and the evaluation for performance were satisfactory. The results are shown in Table 1.

As evaluation for the heat/cold cycle, the tube at room temperature was first immersed in liquid nitrogen. Then after the temperature of the tube itself was maintained at the liquid nitrogen temperature for 30 min, the performance to shield a magnetic field inside it was measured in the liquid. Subsequently the tube was taken out of the liquid and left at room temperature. Finally, after 30 min had passed the temperature of the entire tube reached room temperature. This whole process completes one cycle, and five cycles were done.

The performance to shield the magnetic field inside it from outside after the fifth cycle is compared to that after the first cycle by the following equation and evaluated as "○" for more than 80%, "Δ" for more than 50% and "×" for less than 50%.

$$\text{Evaluation (\%)} = \frac{\text{Performance to shield magnetic field after the fifth heat/cool cycle}}{\text{Performance to shield magnetic field after the first heat/cool cycle}} \times 100$$

TABLE 1

| | Superconductive tube for magnetic shielding | | | Substrate | | | |
|---|---|---|---|---|---|---|---|
| | Diameter × Height (mm) | Bottom member | Radius of curvature (R) (mm) | Material | Divided Mode | Number of members | Joint mode* |
| Example | | | | | | | |
| 1 | φ 500 × 1000 | absence | — | Inconel | FIG. 1 | 4 | (a) |
| 2 | φ 500 × 1000 | absence | — | Inconel | FIG. 1 | 4 | (a) |
| 3 | φ 500 × 1000 | absence | — | Inconel | FIG. 1 | 4 | (b) |

TABLE 1-continued

| | | | | | | | |
|---|---|---|---|---|---|---|---|
| 4 | φ 500 × 1000 | absence | — | Inconel | FIG. 1 | 4 | (c) |
| 5 | φ 500 × 1000 | absence | — | Inconel | FIG. 1 | 4 | (c) |
| 6 | φ 500 × 1000 | absence | — | Inconel | FIG. 1 | 4 | (e) |
| 7 | φ 500 × 1000 | absence | — | Inconel | FIG. 1 | 4 | (d) |
| 8 | φ 500 × 1000 | absence | — | Inconel | FIG. 1 | 4 | (d) |
| 9 | φ 500 × 1000 | absence | — | SUS304 | FIG. 1 | 4 | (d) |
| 10 | φ 500 × 1000 | absence | — | SUS430 | FIG. 1 | 4 | (d) |
| 11 | φ 500 × 1000 | absence | — | SUS310S | FIG. 1 | 4 | (d) |
| 12 | φ 500 × 1000 | presence | 250 | Inconel | FIG. 5(a) | 4 | (d) |
| 13 | φ 500 × 1000 | presence | 250 | Inconel | FIG. 5(b) | 8 | (d) |
| 14 | φ 500 × 1000 | absence | — | Inconel | FIG. 2 | 2 | (c) |
| 15 | φ 500 × 1000 | presence | 50 | Inconel | FIG. 5(d) | 3 | (c) |
| 16 | φ 650 × 2000 | absence | — | Inconel | FIG. 1 | 4 | (c) |
| 17 | φ 650 × 2000 | absence | — | Inconel | FIG. 2 | 4 | (c) |
| 18 | φ 650 × 2000 | presence | 325 | Inconel | FIG. 5(c) | 5 | (c) |
| 19 | φ 650 × 2000 | presence | 325 | Inconel | FIG. 5(e) | 8 | (c) |
| 20 | φ 650 × 2000 | presence | 325 | Inconel | FIG. 5(d) | 5 | (c) |
| 21 | φ 800 × 3000 | absence | — | Inconel | FIG. 1 | 6 | (a) |
| 22 | φ 800 × 3000 | absence | — | Inconel | FIG. 2 | 6 | (b) |
| 23 | φ 800 × 3000 | presence | 400 | Inconel | FIG. 5(b) | 12 | (a) |
| 24 | φ 800 × 3000 | presence | 200 | Inconel | FIG. 5(d) | 7 | (d) |
| 25 | φ 800 × 3000 | presence | 200 | Inconel | FIG. 5(f) | 7 | (c) |

| | Intermediate medium | | | | Firing temp. in oxygen-riched gas (°C.) | Heat-treating temp. in nitrogen gas (°C.) | Evaluation | |
|---|---|---|---|---|---|---|---|---|
| | Glass layer | | Ag layer | | | | | |
| Example | Thickness (μm) | Shape | Thickness (μm) | Joining Method | | | Visual Appearance | Cold/heat cycle |
| 1 | 100 | Lattice | 300 | Welding | 885 | 700 | Good | ○ |
| 2 | 100 | Lattice | 300 | Ag-paste | 885 | 700 | Good | ○ |
| 3 | 100 | Lattice | 300 | Welding | 885 | 700 | Good | ○ |
| 4 | 100 | Lattice | 300 | Welding | 885 | 700 | Good | ○ |
| 5 | 100 | Lattice | 300 | Ag-paste | 885 | 700 | Good | ○ |
| 6 | 100 | Lattice | 300 | Welding | 885 | 700 | Good | ○ |
| 7 | 100 | Lattice | 300 | Ag-paste | 885 | 700 | Good | ○ |
| 8 | 100 | Lattice | 300 | Welding | 885 | 700 | Good | ○ |
| 9 | 100 | Lattice | 300 | Welding | 885 | 700 | Good | ○ |
| 10 | 100 | Lattice | 300 | Welding | 885 | 700 | Good | ○ |
| 11 | 100 | Lattice | 300 | Welding | 885 | 700 | Good | ○ |
| 12 | 100 | Lattice | 300 | Welding | 885 | 700 | Good | ○ |
| 13 | 100 | Lattice | 300 | Welding | 885 | 700 | Good | ○ |
| 14 | 100 | Lattice | 300 | Welding | 885 | 700 | Good | ○ |
| 15 | 100 | Lattice | 300 | Welding | 885 | 700 | Good | ○ |
| 16 | 100 | Lattice | 500 | Welding | 885 | 700 | Good | ○ |
| 17 | 100 | Lattice | 500 | Welding | 885 | 700 | Good | ○ |
| 18 | 100 | Lattice | 500 | Welding | 885 | 700 | Good | ○ |
| 19 | 100 | Lattice | 500 | Welding | 885 | 700 | Good | ○ |
| 20 | 100 | Lattice | 500 | Welding | 885 | 700 | Good | ○ |
| 21 | 100 | Lattice | 500 | Welding | 885 | 700 | Good | ○ |
| 22 | 100 | Lattice | 500 | Welding | 885 | 700 | Good | ○ |
| 23 | 100 | Lattice | 500 | Welding | 885 | 700 | Good | ○ |
| 24 | 100 | Lattice | 500 | Welding | 885 | 700 | Good | ○ |
| 25 | 100 | Lattice | 500 | Welding | 885 | 700 | Good | ○ |

*(a)~(d) show joint mode in FIG. 6 respectively.

EXAMPLES 2 to 25

The tubes by the present invention were obtained in the same procedures as those in Example 1, except for the conditions shown in Table 1, i.e., the presence or the absence of a bottom member in a tube, shape of members, mode of joining members, thicknesses of the glass layer and of the Ag layer, and the mode of joining the glass layers and/or the Ag layers, the sintering temperature under an oxygen atmosphere, and the heat treatment temperature under a nitrogen atmosphere. Each of the tubes obtained was evaluated for visual appearance and performance after cold/heat cycles. The results are shown in Table 1.

COMPARATIVE EXAMPLES 1 to 8

Each of the tubes was obtained by the same procedures as those in Example 1, except for forming cylindrical substrates integrally, changing the thickness of the glass layer and the Ag layer in the intermediate medium, the sintering temperature under an oxygen atmosphere, and the heat treatment temperature under a nitrogen atmosphere, as shown in Table 2. Each of these tubes was evaluated for visual appearance and performance after the cold/heat cycles. The results are shown in Table 2. In evaluation for the visual appearance in the table, X represents local unevenness in the binding portion between the glass and the Ag layer.

TABLE 2

| | Substrate a cylinder without bottom | | Intermediate medium | | | | Firing temp. in oxygen riched gas (°C.) | Heat treating temp. in nitrogen gas (°C.) | Evaluation | |
|---|---|---|---|---|---|---|---|---|---|---|
| | Diameter × height (mm) | Material | Formed side on the substrate | Glass layer Thickness (μm) | Shape | Ag layer Thickness (μm) | | | Visual apperance | Cold/heat cycle |
| Comparative Example | | | | | | | | | | |
| 1 | φ 100 × 450 | Inconel | Outer | 100 | Lattice | 300 | 850 | 450 | Good | o |
| 2 | φ 300 × 500 | Inconel | Outer | 100 | Lattice | 500 | 850 | 450 | Good | o |
| 3 | φ 500 × 500 | Inconel | Outer | 100 | Lattice | 300 | 850 | 450 | Good | o |
| 4 | φ 500 × 500 | Inconel | Inner | 100 | Lattice | 300 | 850 | 450 | Good | o |
| 5 | φ 500 × 1000 | Inconel | Outer | 100 | Lattice | 500 | 850 | 450 | X | X |
| 6 | φ 650 × 2000 | Inconel | Outer | 100 | Lattice | 500 | 850 | 450 | X | X |
| 7 | φ 650 × 2000 | Inconel | Inner | 100 | Lattice | 500 | 850 | 450 | X | X |
| 8 | φ 800 × 3000 | Inconel | Inner | 100 | Lattice | 500 | 850 | 450 | X | X |

As apparent from the examples and the comparative examples described above, when a tube is relatively small with a height up to 500 mm, both of a tube with a cylindrical substrate formed integrally by a conventional method and a tube with a cylindrical substrate made out of members according to the present invention were evaluated as satisfactory for visual appearance and performance after the cold/heat cycles.

On the other hand, when a tube has a height greater than 1000 mm, it was difficult to uniformly form the glass layer satisfactorily adhesive to the integral cylindrical substrate. Local unevenness was observed in the bound portion between the lattice-like glass layer and the Ag layer, reducing superconductive properties and greatly affecting the performance adversely to shield a magnetic field after the cold/heat cycles.

In contrast, when a tube with a height greater than 1000 mm was manufactured with members according to the present invention, either the intermediate medium or the layer containing a superconductive oxide became highly homogeneous, and satisfactory results were obtained both of visual appearance and of performance to shield a magnetic field after the cold/heat cycles.

EXAMPLE 26

A lattice-like glass layer was formed on each of the members, except for a portion of the flange, to obtain laminated members 8 with a glass layer in the same procedures as those in Example 1; the only exception in this procedure is the size of the tube to be formed: it had the diameter of 100 mmφ and a height of 450 mm.

A silver cylindrical shell 3 with a diameter of 100 mm was independently formed by abutting and welding Ag foils having a thickness of 300 μm, and then it was reinforced and supported by a core material made of metal.

Then after combining and arranging each of the laminated and joined members 8 so as to surround the periphery of the thus obtained Ag foil cylindrical shell 3, they were heated between about 850° and about 900° C. for one hour to bind the glass layer 2 and the Ag foil cylindrical shell 3. Subsequently, in the same manner as in Example 1, each of the members 1 was fixed by flanges in the mode shown in FIG. 6 (a) to fabricate a cylindrical laminate 10.

A layer containing a superconductive oxide with a thickness of 250 μm was formed integrally on the Ag layer of the resultant cylindrical laminate 10 in the same manner as in Example 1, to obtain a tube.

The appearance of the tube thus formed was visually observed and the cold/heat cycle was evaluated in the same manner as in Example 1. The results are shown in Table 3.

TABLE 3

| | Superconductive tube for magnetic shielding | | | Substrate | | | | Intermediate medium | | | Evaluation | |
|---|---|---|---|---|---|---|---|---|---|---|---|---|
| | Diameter × Height (mm) | Bottom member | Radius of curvature (R) (mm) | Material | Divided Mode | Number of members | Joint mode | Formed side on the substrate | Ag layer Thickness (μm) | Joining Method | Visual Appearance | Cold/heat cycle |
| Example | | | | | | | | | | | | |
| 26 | φ 100 × 450 | absence | — | Inconel | FIG. 1 | 4 | Flange | Inner | 300 | Welding | Good | o |
| 27 | φ 100 × 450 | absence | — | Inconel | FIG. 1 | 4 | Welding | Inner | 500 | Welding | Good | o |
| 28 | φ 100 × 450 | absence | — | Inconel | FIG. 1 | 6 | Welding | Inner | 500 | Welding | Good | o |
| 29 | φ 300 × 500 | absence | — | Inconel | FIG. 1 | 4 | Welding | Inner | 500 | Welding | Good | o |
| 30 | φ 300 × 500 | absence | — | Inconel | FIG. 1 | 4 | Flange | Inner | 500 | Welding | Good | o |
| 31 | φ 500 × 1000 | absence | — | Inconel | FIG. 1 | 4 | Flange | Inner | 500 | Welding | Good | o |
| 32 | φ 500 × 2000 | absence | — | Inconel | FIG. 1 | 4 | Flange | Inner | 500 | Welding | Good | o |
| 33 | φ 650 × 2000 | absence | — | Inconel | FIG. 1 | 4 | Flange | Inner | 500 | Welding | Good | o |
| 34 | φ 650 × 2500 | presence | 325 | Inconel | FIG. 1 | 4 | Flange | Inner | 500 | Welding | Good | o |
| 35 | φ 1000 × 3000 | absence | — | Inconel | FIG. 1 | 4 | Flange | Inner | 500 | Welding | Good | o |
| 36 | φ 1000 × 3000 | presence | 500 | Inconel | FIG. 1 | 4 | Flange | Inner | 500 | Welding | Good | o |
| 37 | φ 1000 × 3000 | presence | 200 | Inconel | FIG. 1 | 4 | Welding | Inner | 500 | Welding | Good | o |
| 38 | φ 100 × 450 | absence | — | SUS304 | FIG. 1 | 4 | Welding | Inner | 300 | Ag-paste | Good | Δ |
| 39 | φ 100 × 450 | absence | — | SUS430 | FIG. 1 | 4 | Welding | Inner | 300 | Ag-paste | Good | o |
| 40 | φ 100 × 450 | absence | — | SUS310 S | FIG. 1 | 4 | Welding | Inner | 300 | Ag-paste | Good | Δ |

EXAMPLES 27 to 40

The tubes according to the present invention were obtained using the same procedures as those in Example 26, except for the conditions shown in Table 3, i.e., the presence or the absence of a bottom member in a tube, shape of members, mode of joining members, thickness of the Ag layer, and the mode of joining the Ag layers. Each of the tubes obtained was evaluated for visual appearance and performance to shield magnetic field after the cold/heat cycles. The results are shown in Table 3.

COMPARATIVE EXAMPLES 9 to 18

The tubes according to the present invention were obtained using the same procedures as those in Example 26, except for integrally forming a cylindrical substrate and changing the thickness of the Ag layer as shown in Table 4. Each of the tubes obtained was evaluated for visual appearance and performance to shield a magnetic field after the cold/heat cycles. The results are shown in Table 4. In the evaluation for visual appearance in the table, X represents local unevenness in the binding portion between the glass and the Ag layer and Y represents insufficient welding.

TABLE 4

| Supercondutive tube for magnetic shielding | | | Substrate | | | | Intermediate medium | | | Evaluation | |
|---|---|---|---|---|---|---|---|---|---|---|---|
| Diameter × Height (mm) | Bottom member | Radius of curvature (R) (mm) | Material | Divided Mode | Number of members | Joint mode | Formed side on the substrate | Ag layer Thickness (μm) | Ag layer Joining Method | Visual Appearance | Cold/heat cycle |
| Comparative Example | | | | | | | | | | | |
| 9 | φ 100 × 450 | absence | — | SUS304 | — | — | — | Inner | 300 | Ag-paste | X, Y | x |
| 10 | φ 100 × 450 | absence | — | SUS430 | — | — | — | Inner | 300 | Ag-paste | X, Y | x |
| 11 | φ 100 × 450 | absence | — | SUS310 S | — | — | — | Inner | 300 | Ag-paste | X, Y | x |
| 12 | φ 100 × 450 | absence | — | Inconel | — | — | — | Inner | 300 | Ag-paste | X, Y | x |
| 13 | φ 100 × 450 | absence | — | Inconel | — | — | — | Inner | 500 | Welding | X | x |
| 14 | φ 300 × 500 | absence | — | Inconel | — | — | — | Inner | 500 | Welding | X | x |
| 15 | φ 500 × 1000 | absence | — | Inconel | — | — | — | Inner | 500 | Welding | X | x |
| 16 | φ 500 × 1000 | presence | 250 | Inconel | — | — | — | Inner | 500 | Welding | X | x |
| 17 | φ 650 × 2000 | absence | — | Inconel | — | — | — | Inner | 500 | Welding | X | x |
| 18 | φ 650 × 2000 | absence | — | Inconel | — | — | — | Inner | 500 | Welding | X | x |

These examples and comparative examples show that the tubes of the present invention are superior to those made in prior art. A method of manufacturing the tube of the present invention in which a cylindrical shell of silver independently made was place upon a glass layer on the cylindrical substrate, led to a tube with satisfactory appearance and performance to shield magnetic field.

Another method of manufacturing the tube of the present invention in which a cylindrical shell of silver independently made was placed upon laminated members with glass layers arranged in the periphery of the shell of silver, and then in which the members with glass layers thus placed against the shell were joined among themselves, led to a tube with satisfactory appearance and performance to shield magnetic field.

In the comparative examples in which a cylindrical shell of silver is placed upon a cylindrical substrate with a glass layer, the heights of the cylindrical structures were found to be irrelevant to obtain a highly homogeneous layer containing superconductive oxide. Joint portions between silver layers and those between the silver layer and the glass layer did not achieve satisfactory homogeneity, which adversely affect the homogeneity in the layer containing a superconductive oxide placed upon them. As a result, the performance to shield a magnetic field significantly deteriorated after the cold/heat cycles.

What is claimed is:

1. A superconductive tube for magnetic shielding, comprising:
   a cylindrical substrate composed of at least two members;
   an intermediate medium placed upon surface of at least one of the inner and the outer wall of said substrate; and
   a layer containing superconductive oxide placed upon said intermediate medium.

2. A superconductive tube for magnetic shielding as recited in claim 1, wherein some of said members are joined parallel with the axial direction of said substrate.

3. A superconductive tube for magnetic shielding as recited in claim 1, wherein some of said members are joined perpendicular to the axial direction of said substrate.

4. A superconductive tube for magnetic shielding as recited in claim 1, wherein some of said members are joined in the direction slanted to the axial direction of said substrate.

5. A superconductive tube for magnetic shielding as recited in claim 1, further comprising one or more bottom member connected to bottom rim in side portion of said substrate.

6. A superconductive tube for magnetic shielding as recited in claim 5, wherein said one or more bottom member is continuously connected to all the bottom rim in side portion of said substrate.

7. A superconductive tube for magnetic shielding as recited in claim 6, wherein said one or more bottom member is continuously connected with at least one of a blunt angle and a radius of curvature greater than 5 mm from inside of said substrate to all the bottom rim in the side portion of said substrate.

8. A superconductive tube for magnetic shielding as defined in claim 1, wherein said intermediate medium comprises a layer of a noble metal that contacts with said layer containing superconductive oxide.

9. A superconductive tube for magnetic shielding as defined in claim 8, wherein said intermediate medium, further comprises a second layer that is situated between said layer of a noble metal and surface of at least one of the inner and the outer wall of said substrate.

10. A superconductive tube for magnetic shielding as defined in claim 2, 3, 4, or 5, wherein said intermediate medium comprises a layer of a noble metal that contacts with said layer containing superconductive oxide.

11. A superconductive tube for magnetic shielding as defined in claim 10, wherein said intermediate medium, further comprises a second layer that is situated between said layer of a noble metal and surface of at least one of the inner and the outer wall of said substrate.

12. A superconductive tube for magnetic shielding as defined in claim 9, wherein said substrate is metal and the second layer essentially consists of ceramics.

13. A superconductive tube for magnetic shielding as defined in claim 9, wherein said second layer contains glass.

14. A superconductive tube for magnetic shielding as defined in claim 9, wherein said second layer essentially consists of glass.

15. A superconductive tube for magnetic shielding as defined in claim 1, 2, 3, or 4, wherein said layer containing superconductive oxide is in an integral form.

16. A superconductive tube for magnetic shielding as defined in claim 12, wherein said second layer partially covers the surface of at least one of the inner and the outer wall of said substrate in any size, any shape, or any pattern.

17. A method for manufacturing a superconductive tube for magnetic shielding which comprises:
    forming an intermediate medium upon a surface of at least one of the inner and the outer walls of members;
    making a cylindrical substrate by joining said members; and
    forming a layer containing superconductive oxide on said intermediate medium on said cylindrical substrate.

18. A method for manufacturing a superconductive tube for magnetic shielding which comprises:
    forming an intermediate medium upon a surface of at least one of the inner and the outer walls of members;
    making a cylindrical substrate by connecting said members;
    preparing a cylindrical shell of a noble metal;
    placing said cylindrical shell upon said cylindrical substrate to make a cylindrical green tube; and
    forming a layer containing superconductive oxide upon the surface of said cylindrical shell thus made.

* * * * *